United States Patent [19]

van Roermund et al.

[11] 4,428,070
[45] Jan. 24, 1984

[54] DYNAMIC CIRCULATION MEMORY

[75] Inventors: Arthur H. M. van Roermund; Petrus M. C. Coppelmans, both of Eindhoven, Netherlands

[73] Assignee: U.S. Philips Corporation, New York, N.Y.

[21] Appl. No.: 162,693

[22] Filed: Jun. 24, 1980

[30] Foreign Application Priority Data

Jun. 28, 1979 [NL] Netherlands ................. 7905023
Sep. 14, 1979 [NL] Netherlands ................. 7906863

[51] Int. Cl.³ .................. G11C 7/00; G11C 21/00
[52] U.S. Cl. .................. 365/222; 365/73
[58] Field of Search ............. 365/73, 183, 45, 222

[56] References Cited

U.S. PATENT DOCUMENTS

| | | | |
|---|---|---|---|
| 3,999,171 | 12/1976 | Parsons | 365/45 |
| 4,202,046 | 5/1980 | Ward | 365/222 |
| 4,209,852 | 6/1980 | Hyatt | 365/183 |
| 4,280,196 | 7/1981 | Hornak et al. | 365/45 |

Primary Examiner—Stuart N. Hecker
Attorney, Agent, or Firm—Paul R. Miller

[57] ABSTRACT

A dynamic circulation memory is provided comprising a charge transfer device with surplus-value storage and an adaptive refreshing circuit for maximum information storage. Reference-charge packets are passed through the charge transfer device together with the signal-charge packets, so that signal distortion caused by the charge transfer device and its interface is compensated for.

5 Claims, 5 Drawing Figures

DYNAMIC CIRCULATION MEMORY

The invention relates to a dynamic circulation memory provided with an adaptive control, comprising a charge transfer device with a semiconductor body, which comprises a semiconductor layer of one conductivity type, an input being provided for locally introducing information in the form of signal-charge packets into the semiconductor layer, and an output for reading out the information elsewhere in the layer, control electrodes being provided on at least one side of the semiconductor layer for producing electric fields in the semiconductor layer by means of multi-phase clock signals, with the aid of which fields signal charge packets formed by the input can be transferred to the output in a direction parallel to the layer, the adaptive control being included in a loop between the output and the input of the charge transfer device. A charge transfer device is a not entirely ideal analog shift register, which transfers signal samples in the form of charge packets from the input to the output of the device. Such an analog shift register may be employed as a dynamic circulation memory when the information in the charge transfer device is fed back to the input of the transfer device by a refreshing circuit, which inter alia performs signal quantization. The information then circulates in a closed loop. The operations to be performed by the refreshing circuit depend on the errors introduced into the signal to be processed by the charge transfer device and on the number of quantization levels used. In general the signal should be refreshed before the overall error in the signal exceeds half a quantization step. The signal is then restored to its original value.

Such a dynamic circulation memory is for example known from "IEEE Transactions on Electron Devices," February 1976, Volume ED-23, No. 2, page 89, FIG. 8. In this known memory the adaptive control inter alia comprises a comparator and a dummy charge-transfer device. The output of the charge transfer device is connected to the one input of the comparator, while the other input of the comparator is connected to the output of the dummy charge-transfer device. The output of the comparator is coupled to the input of the charge-transfer device, which is also coupled to the signal source supplying the signal to be processed. In this known memory a reference-voltage source is connected to the input of the dummy charge-transfer device. The reference-voltage source supplies a constant voltage, whose magnitude is intermediate between the highest and the lowest signal level of the input signal. If the highest signal level corresponds to a logic 1 and the lowest signal level corresponds to a logic 0, the signal supplied by the reference-voltage source will thus correspond to a value $\frac{1}{2}$. It is now assumed that the reference voltage value of $\frac{1}{2}$, when it is passed through the dummy charge-transfer device, is subject to the same errors as the signal to be processed when it is passed through the charge-transfer device.

At the output of the charge transfer device each signal sample which, at the input of the charge transfer device, was greater than the reference charge value of $\frac{1}{2}$, will also be greater than the value which the reference charge value of $\frac{1}{2}$ still has after passage through the dummy charge-transfer device. At the output of the charge transfer device each signal sample which, at the input of the charge-transfer device, is smaller than the reference charge value of $\frac{1}{2}$, will also be smaller than the value which the reference charge value of $\frac{1}{2}$ still has after passage through the dummy charge-transfer device. After the afore-mentioned facts have been ascertained by the comparator, the comparator will decide whether a correct logic 1 or a correct logic 0 is to be supplied to the input of the charge-transfer device.

This known dynamic circulation memory has the drawback that only the position of the intermediate level $\frac{1}{2}$ is corrected. However, the correct distance of the signal charge packets relative to the intermediate level are not corrected, so that the known memory is only suitable for binary applications. The known memory lacks the possibility of correcting other reference levels situated between the extreme values of the input signal, in order to enable the use of quantization levels.

It is an object of the invention to mitigate the drawbacks and the invention is characterized in that there are provided means in the adaptive control for subjecting a first charge packet, which is proportional to a first reference level, and the second charge packet, which is proportional to a second reference level, to substantially the same process as that to which a signal charge packet is subjected from the input to the output of the charge transfer device, the adaptive control including a circuit which determines the relative magnitude of the signal charge packets with respect to the magnitude of the first and the second charge packets and which also causes the signal charge packets to be subjected to the same process as the first and second charge packets would have to be subjected to in order to be restored to their original values.

It is to be noted that passing two different reference charge packets with the signal charge packets through the same charge transfer circuit is known per se from U.S. Pat. No. 4,143,285 of Mar. 6, 1979 (White, Rockwell Incorp.), in which case this technique is used in a data smear compensation circuit for a charge transfer device.

The invention will be described in more detail with reference to the drawing.

FIG. 1b shows an example of a charge transfer device for use in memory of FIG. 1a, FIG. 2 represents a voltage diagram in order to explain the operation of the memory of FIG. 1a.

Figure 1A:
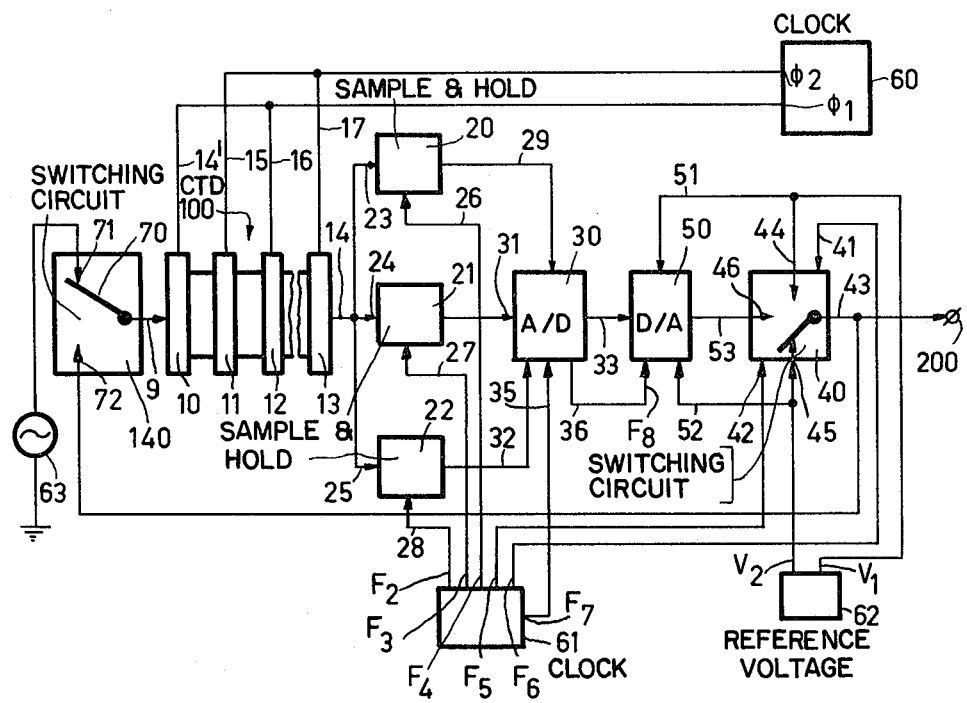
FIG. 1a represents an embodiment of a dynamic circulation memory in accordance with the invention.
Figure 1B:
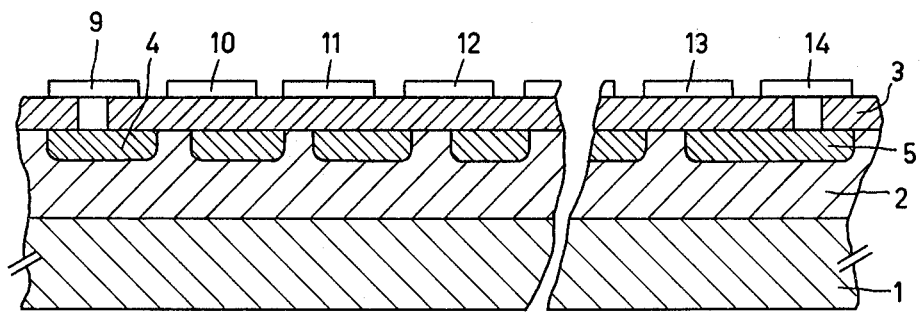

The dynamic circulation memory of FIG. 1 comprises a charge transfer device 100, a first switching circuit 140, a first sample-and-hold circuit 21, a second sample-and-hold circuit 20, a third sample-and-hold circuit 22, an analog-to-digital converter 30, a digital-to-analog converter 50, and a second switching circuit 40. The first series arrangement is constituted by the first switching circuit 140 and the charge transfer device 100. The second series arrangement is constituted by the second switching circuit 40 and the digital-to-analog converter 50. The output 43 of the second series arrangement is connected to the input 72 of the first series arrangement. The input 71 of the first switching circuit 140 is connected to a point of constant potential by the signal-voltage source 63. The output 70 of the first switching circuit is connected to the control input 9 of the charge transfer device 100. The output 14 of the charge transfer device 100 is connected to the inputs of the first, second and third sample-and-hold circuit 21, 20 and 22 respectively. The output 29 of the second sample-and-hold circuit 20 is connected to a first control input of the analog-to-digital converter 30. The output 31 of the first sample-and-hold circuit 21 is connected to the signal input of the analog-to-digital converter 30. The output 32 of the third sample-and-hold circuit 22 is connected to a second control input of the analog-to-digital converter 30. The clock input 26 of the second sample-and-hold circuit 20 is connected to that output of the clock voltage generator 61 at which the clock signal of the phase F4 is available. The clock input 27 of the first sample-and-hold circuit 21 is connected to that output of the clock voltage generator 61 at which the clock signal of the phase F3 is available. The clock input 28 of the third sample-and-hold circuit 22 is connected to that output of the clock voltage generator 61 at which the clock signal of the phase F2 is available. The clock input 35 of the analog-to-digital converter 30 is connected to that output of the clock voltage generator 61 at which the clock signal of the phase F7 is available. The output 33 of the analog-to-digital converter 30 is connected to the signal input of the digital-to-analog converter 50. The control output 36 of the analog-to-digital converter 30 is connected to the control input F8 of the digital-to-analog converter 50. The control input 51 of the digital-to-analog converter 50 is connected to that output of the reference-voltage source 62 at which the reference voltage V1 is available. The control input 52 of the digital-to-analog converter 50 is connected to that output of the reference-voltage source 62 at which the reference voltage V2 is available. The output 53 of the digital-to-analog converter 50 is connected to a switching contact 46 of the second switching circuit 40. The switching contact 44 is connected to that output of the reference-voltage source 62 at which the reference voltage V1 is available. The switching contact 45 of the second switching circuit 40 is connected to that output of the reference-voltage source 62 at which the reference voltage V2 is available. The control input 41 of the second switching circuit 40 is connected to that output of the clock-voltage generator 61 at which the clock voltage of the phase F6 is available. The control input 42 of the second switching circuit 40 is connected to that output of the clock voltage generator 61 at which the clock voltage of the phase F5 is available. The output 43 of the second switching circuit 40 is connected to the switching contact 72 of the first switching circuit 140 and to the output 200 of the memory. The charge-transfer device 100 may for example be as is schematically represented in FIG. 1b. It comprises a semiconductor body one with a semiconductor layer 2 of n-type silicon. On the semiconductor layer 2 a number of control electrodes 10, 11, 12 and 13 are arranged on at least one side of the layer 2. Via the respective conductors 14' and 16 the control electrodes 10 and 12 are connected to that output of the switching-voltage source 60 at which the clock signal of the phase $\phi_1$ is available. By the respective conductors 15 and 17 the control electrodes 11 and 13 are connected to that output of the clock-voltage generator 60 at which the clock signal of the phase $\phi_2$ is available. On the semiconductor layer 2 an insulating layer 3 is deposited. The input diffusion 4 together with the input electrode 9 constitutes the control input of the charge transfer device 100. The output diffusion 5 together with the output electrode 14 constitutes the output of the charge transfer device 100. The charge transfer device 100 is for example of the type as described in Netherlands Patent Application, corresponding to U.S. Pat. No. 4,266,146. Other charge transfer devices as described in Netherlands Patent Application Nos. 6,805,705 and 7,114,770, as well as in "Electronics," June 21, 1971, on pages 50 through 59, may be employed in the memory in accordance with the invention.

Figure 4:
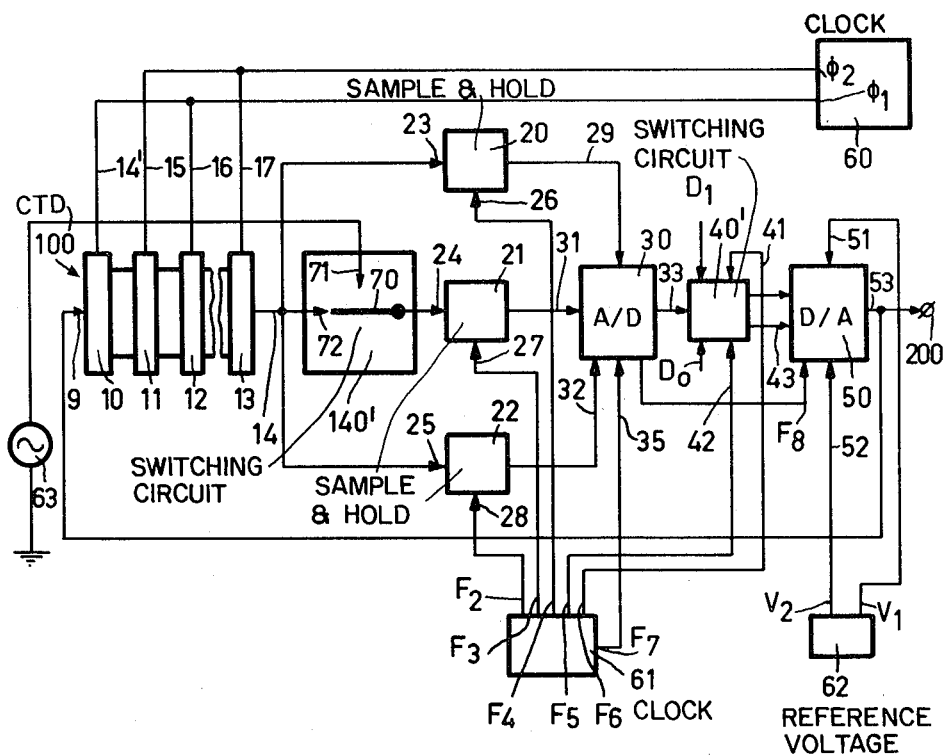
FIG. 4 represents a second embodiment of the memory in accordance with the invention.

For the sample-and-hold circuits 20, 21 and 22 it is for example possible to employ circuits as described in "IEEE Journal of Solid-State Circuits," Volume Sc 12, No. 2, June 1977, page 233, FIGS. 4 and 5.

For the analog-to-digital converter 30 it is for example possible to employ a circuit as described in "Digest of Technical Papers, ISSCC," Feb. 12, 1975, pages 38, 39.

For the digital-to-analog converter 50 it is for example possible to employ a circuit as described in "Digest of Technical Papers, ISSCC," Feb. 20, 1977, pages 202 and 203.

Figure 2:
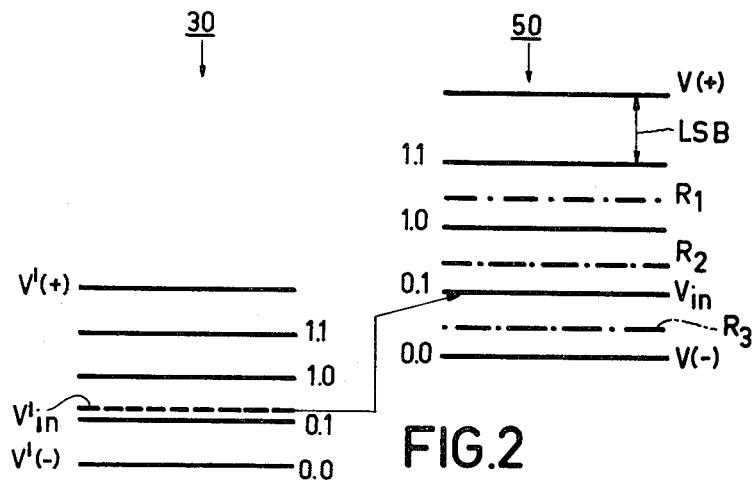

In the circuit of FIG. 1a the adaptive refreshing circuit comprises an analog switch 140, sample-and-hold circuits 20, 21 and 22, an analog-to-digital converter 30, a digital-to-analog converter 50, and the second switching circuit 40. The sample-and-hold circuits 20 and 22 extract the incorrect reference voltages V' (+) and V' (−), see FIG. 2, from the output signal of the charge transfer device 100 and apply these reference voltages to the reference inputs 29 and 32 respectively of the analog-to-digital converter 30, until the new reference signals arrive at the output of the charge transfer device 100. The sample-and-hold circuit 21 is necessary in order to hold the signal during the analog-to-digital conversion. The analog-to-digital converter 20 supplies a binary code word, which is a quantized equivalent of the position of the signal V' (in), see FIG. 2, between the two reference voltages V' (+) and V' (−), see FIG. 2. Consequently, it does not represent the absolute value of V' (in). This binary code word, in the present instance 01, is converted by the digital-to-analog converter into an analog voltage V (in), which now occupies the same position between the correct reference voltages V (+) and V (−) as the quantized V' (in) occupied between the incorrect reference voltages V' (+) and V' (−), see FIG. 2. An equal offset of an equal attenuation to which the voltages V(in), V(+) and V(−) are subject between the input of the charge transfer device and the control inputs of the analog-to-digital converter, as well as in the analog-to-digital converter itself, has no influence on the binary code word 01. Thus, when the voltage V (in), V (+) and V (−) are transferred through the charge transfer device 100 they will appear on the inputs of the analog-to-digital converter in modified form as a result of attenuation, offset and other errors. After having passed through the refreshing circuit V(in) is restored to its original value.

Figure 3:
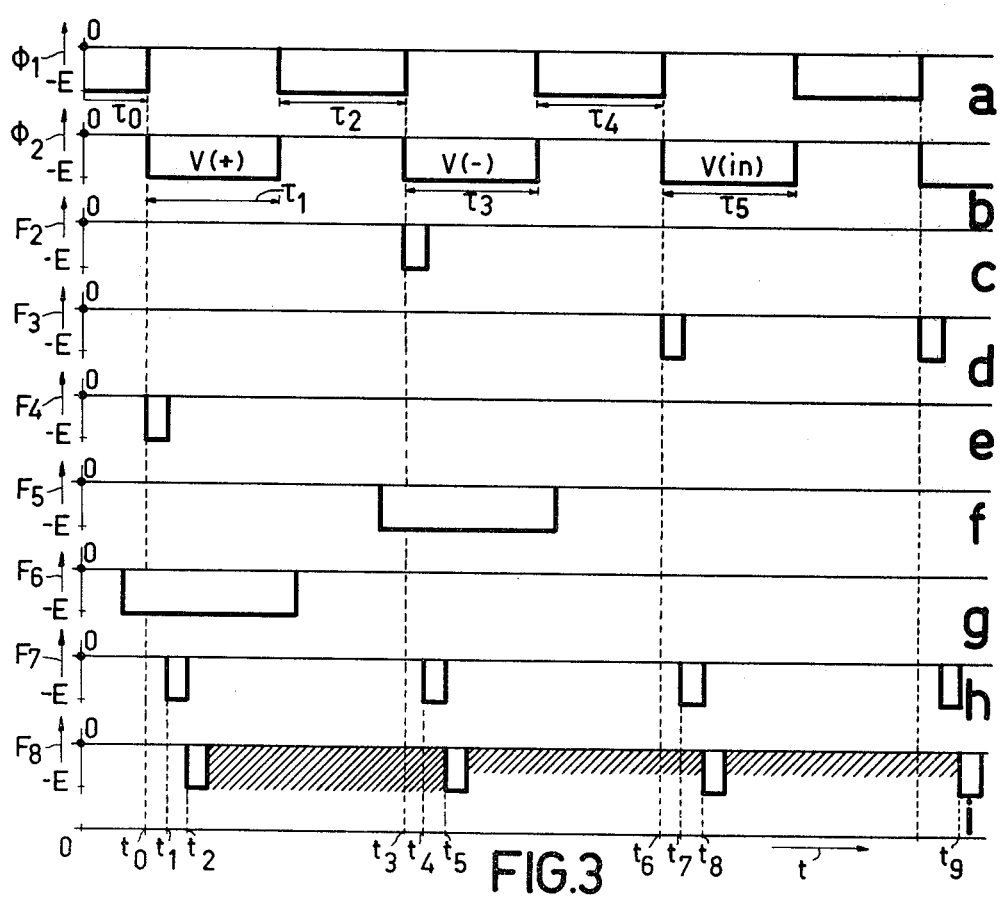
FIG. 3 is a diagram representing the clock signals as a function of time.

FIG. 3 shows how the samples of V(+), V(−) and V(in) are transferred from the output of the charge transfer device 100, which may for example be TDA 1022, Philips data handbook, part 5a, 1976, to the input of the charge-transfer device 100 by the adaptive refreshing circuit. At the instants that the clock voltage $\phi_2$ becomes negative, a charge packet will appear on the output 14 of the charge transfer device 100, where it remains for example for approximately half a clock period of the clock voltage. This is for example during the time intervals $\tau_1$, $\tau_3$ and $\tau_5$, as is illustrated in FIG. 3b. For example, in the time interval $\tau_1$ a charge packet corresponding to the reference voltage V(+) will appear on the output 14 of the charge transfer device 100. In the time interval $\tau_3$ a charge packet corresponding to the reference voltage $V(-)$ will appear on the output 14 of the charge transfer device 100. In the time interval $\tau_5$ a charge packet corresponds to the signal V (in) will appear on the output of the charge transfer device 100. When the voltage $F_4$ decreases, i.e. at the instant $t_0$, the charge packet corresponding to the reference voltage $V(+)$ is transferred to the sample-and-hold circuit 20 and is held at the instant $t_1$.

In the time interval $\tau_3$ a charge packet corresponding to the reference voltage $V(-)$ will appear on the output 14 of the charge transfer device 100. When the voltage $F_2$ decreases, i.e. at the instant $t_3$, the charge packet is transferred to the sample-and-hold circuit 22 and is held at the instant $t_4$.

In the time interval $\tau_5$ a charge packet corresponding to the signal voltage V(in) will appear on the output 14 of the charge transfer device 100. When the voltage $F_3$ decreases, i.e. at the instant $t_6$, the charge packet is transferred to the sample-and-hold circuit 21 and held at the instant $t_7$. When the voltage $F_7$ decreases, i.e. at the instant $t_7$, the analog-to-digital converter 30 is started. The information available at its input is then converted to an equivalent digital signal and is retained. At instant $t_8$ the digital-to-analog converter 50 is also started and the information at its input 33 is converted into an equivalent analog signal. In the time interval between the instants $t_8$ and $t_9$, shown hatched, the last-mentioned analog signal will appear on the output 53 of the digital-to-analog converter and on the input 9 of the charge-transfer device 100.

The afore-mentioned charge packets appear on the output 14 of the charge transfer device 100, when the clock voltage $\phi_2$ decreases, and remain there for example during approximately half a period of the clock voltage $\phi_2$. However, the charge packets should appear on the input 9 of the charge transfer device 100 when the clock voltage $\phi_2$ goes high. Thus, the time which is available for refreshing the signal is only half the period of the clock signal $\phi_2$.

By periodically passing the reference charge packets through the charge transfer device, so that the adaptive loop is periodically corrected, a correction for temperature errors is also obtained.

The system automatically adapts itself to any charge transfer device which may be included in the loop. Moreover, because the system operates with two reference charge packets, operation with more than two quantization levels is possible. Consequently, the use of the system is not limited to binary applications only.

FIG. 4 shows a second embodiment of the dynamic circulation memory in accordance with the invention. It comprises a charge transfer device 100, a first switching circuit 140', a first sample-and-hold circuit 21, a second sample-and-hold circuit 20, a third sample-and-hold circuit 22, an analog-to-digital converter 30, a second switching circuit 40' and a digital-to-analog converter 50. The first series arrangement is constituted by the charge transfer device 100 and the first switching circuit 140'. The second series arrangement is constituted by the second switching circuit 40' and the digital-to-analog converter 50. The output 53 of the second series arrangement is connected to the input 9 of the first series arrangement. The input 71 of the first switching circuit 140' is connected to a point of constant potential by the signal-voltage source 63. The output 70 of the first switching circuit 140' is connected to the signal input 24 of the first sample-and-hold circuit 21. The output 14 of the charge transfer device 100 is connected to the input 72 of the first switching circuit 140' and is also connected to the respective inputs 23 and 25 of the second and the third sample-and-hold circuit 20 and 22. The output 29 of the second sample-and-hold circuit 20 is connected to a first control input of the analog-to-digital converter 30. The output 31 of the first sample-and-hold circuit 21 is connected to the signal input of the analog-to-digital converter 30. The output 32 of the third sample-and-hold circuit 22 is connected to a second control input of the analog-to-digital converter 30. The clock input 26 of the second sample-and-hold circuit 20 is connected to that output of the clock voltage generator 61 on which the clock signal of the phase $F_4$ is available. The clock input 27 of the first sample-and-hold circuit 21 is connected to that output of the clock-voltage generator 61 on which the clock signal of the phase $F_3$ is available. The clock input 28 of the third sample-and-hold circuit 22 is connected to that output of the clock-voltage generator 61 on which the clock signal of the phase $F_2$ is available. The clock input 35 of the analog-to-digital converter 30 is connected to that output of the clock-voltage generator 61 on which the clock signal of the phase $F_7$ is available. The output 33 of the analog-to-digital converter 30 is connected to the signal input of the second switching circuit 40' whose signal output 43 is connected to the signal input of the digital-to-analog converter 50. The control input 51 of the digital-to-analog converter 50 is connected to that output of the reference-voltage source 62 on which the reference voltage V1 is available. The control input 52 of the digital-to-analog converter 50 is connected to that output of the reference-voltage source 62 on which the reference voltage V2 is available. The output of the digital-to-analog converter 50 is connected to the input 9 of the charge-transfer device 100. The control input 41 of the second switching circuit 40' is connected to that output of the clock-voltage generator 61 on which the clock voltage of the phase $F_6$ is available. The control input 42 of the second switching circuit 40' is connected to that output of the clock-voltage generator 61 on which the clock voltage of the phase $F_5$ is available.

The operation of the dynamic circulation memory of FIG. 4 is substantially the same as the operation of the dynamic circulation memory of FIG. 1a. The only difference is that because the second switching circuit 40' precedes the digital-to-analog converter, a digital switch is used. In FIG. 4 this is represented by the two digital inputs $D_0$ and $D_1$. Input $D_1$ constantly receives a logic 1 and inputs $D_0$ constantly receives a logic 0. On command of $F_6$ all digital inputs of the DA (digital-to-analog converter) are made equal to $D_1$, which substantially results in the positive reference voltage $V(+)$ on the output 53 of the digital-to-analog converter 50. On command of $F_5$ all digital inputs of DA are made equal to $D_0$, which results in the low reference voltage $V(-)$ on the output 53 of the digital-to-analog converter 50. The $V_{ref}(+)$ obtained in this mode is not exactly the desired $V_{ref}(+)$, but one LSB less. This error may be reduced by driving more bits of the DA with the value $D_1$ than when the signal samples are being processed at the instant that $V_{ref}(+)$ is to be made by the DA. Alternatively another DA may be used which on command of $F_6$ can supply the full $V_{ref}(+)$, for example by making the last resistor of a ladder network switchable. In the present example it is assumed that the afore-mentioned charge packet that is proportional to a first reference level and the second charge packet that is proportional to a second reference level correspond to the maximum and the minimum signal voltage respectively. However, it is also possible to make the first and second charge packets correspond to other signal voltages, see FIG. 2. In the present example the analog-to-digital converter needs three reference levels $R_1$, $R_2$ and $R_3$ for the conversion. If the voltage which corresponds to the digital value 1,1 is supplied as first reference level and the voltage which corresponds to the digital value 0,0 as second reference level, the reference levels $R_1$, $R_2$ and $R_3$ may be derived from these two reference levels, for example with the aid of a voltage divider with resistors. The previously mentioned problem that a digital-to-analog converter cannot exactly generate the desired reference level no longer exists in the example now given. The fact that now use is made of a digital switch has the additional advantage that a more accurate signal processing is possible. This is because the errors made by the digital-to-analog converter 50 are now the same for both the signal-charge packets and the reference-charge packets, so that these errors can be corrected automatically by the adaptive control. Furthermore, the digital switch 40' together with the digital-to-analog converter may be combined to one circuit. Normally the operating speeds of the three sample-and-hold circuits 20, 21 and 22 are selected to be equal. However, if a better noise-immunity is required, the operating speed of the two sample-and-hold circuits 20 and 22, which process the reference charge packets, may be reduced. In practice, this means that the hold capacitance may be increased, so that a greater noise immunity is achieved. The foregoing is possible because in any cycle of the control substantially the same reference charge packets are applied to the hold capacitances, so that after a number of cycles still the correct reference voltages are obtained across the two hold capacitances. However, the hold capacitances should not be selected too high, because it should remain possible to track variations in the two reference voltages as a result of temperature variations.

In the two examples given the input signal is applied to the input 9 of the charge transfer device 100. In principle the input signal may be introduced at any point in the control loop, both in analog and in digital form, which depends on the point in the loop selected for applying the input signal.

In addition to the charge-transfer device the adaptive control loop includes components which have memory functions. By a suitable choice of the clock signal the memory functions may also be used as memory locations for the entire control loop. As a result of this, the control loop will have more memory locations and the clock signal frequencies may be increased (pipelining).

What is claimed is:

1. A dynamic circulation memory comprising
a charge transfer device including a semiconductor structure and means for reading out information,
first, second and third sample-and-hold circuits respectively connected to outputs of said charge transfer device,
an analog-to-digital converter receiving signals from said charge transfer device through said first, second and third sample-and-hold circuits,
a digital-to-analog converter receiving signals from said analog-to-digital converter for converting digital signals into analog signals,
first switching means connected in series to said charge transfer device, and
second switching means connected in series to said digital-to-analog converter and feeding signals to said first switching means.

2. A dynamic circulation memory comprising
a charge transfer device including a semiconductor structure and means for reading out information,
first switching means connected in series with said charge transfer device for receiving signals therefrom,
first sample-and-hold circuit receiving signals from said first switching means, and second and third sample-and-hold circuits receiving signals from said charge transfer device,
an analog-to-digital converter receiving signals from said first, second and third sample-and-hold circuits,
second switching means receiving signals from said analog-to-digital converter, and
a digital-to-analog converter receiving signals from said second switching means and feeding signals to said charge transfer device.

3. A dynamic circulation memory provided with an adaptive control comprising:
a charge transfer device including a semiconductor body having a semiconductor layer of one conductivity type, input means for introducing information in the form of signal-charge packets in said semiconductor layer, output means for reading out information from said layer, and control electrode means provided on at least one side of said semiconductor layer for generating electric fields in said semiconductor layer by multiphase clock signals, said electric fields transferring said signal-charge packets to said output means in a direction parallel to said semiconductor layer, wherein a loop between said output means and said input means provides adaptive control,
means in said adaptive control for subjecting a first charge packet proportional to a first reference level and a second charge packet proportional to a second reference level to substantially the same process as that to which one of said signal-charge packets is subjected from said input means to said output means of said charge transfer device, and
circuit means of said adaptive control for determining the relative magnitude of said signal-charge packets with respect to the magnitude of said first and second charge packets, said circuit means also causing said signal-charge packets to be subjected to the same process as said first and second charge packets are subjected in order to be restored to their original values,
wherein said circuit means includes an analog-to-digital converter for converting said signal-charge packets into digital signal values, said analog-to-digital converter being provided with means for applying reference signals proportional to magnitudes of said first and second charge packets for analog-to-digital conversion, and a digital-to-analog converter for converting digital signals from said analog-to-digital converter into analog signals, and
wherein said adaptive control further includes at least three sample-and-hold circuits, a first switching circuit connected in a first series circuit with said charge transfer device to a first of said three sample-and-hold circuits having an output connected to an input of said analog-to-digital converter, and a second switching circuit connected in a second series circuit with said digital-to-analog converter, and wherein said charge transfer device has an output connected to a first control input of said analog-to-digital converter through a second of said three sample-and-hold circuits, and said output of said charge transfer device being conected to a second control input of said analog-to-digital converter through a third of said three sample-and-hold circuits.

4. A dynamic circulation memory according to claim 3, wherein said first series circuit includes said first switching circuit and said charge transfer device, and wherein said second series circuit includes said digital-to-analog converter and said second switching circuit, said second switching circuit having an output connected to an input of said first switching circuit.

5. A dynamic circulation memory according to claim 3, wherein said first series circuit includes said first switching circuit and said charge transfer device, and wherein said second series circuit includes said second switching circuit and said digital-to-analog converter, said digital-to-analog converter having an output connected to an input of said charge transfer device.

* * * * *